(12) United States Patent
Moffatt

(10) Patent No.: US 9,631,101 B2
(45) Date of Patent: Apr. 25, 2017

(54) IONIC LIQUID RELEASE COAT FOR USE IN METAL FLAKE MANUFACTURE

(75) Inventor: John Moffatt, Painesville, OH (US)

(73) Assignee: ECKART AMERICA CORPORATION, Painesville, OH (US)

( * ) Notice: Subject to any disclaimer, the term of this patent is extended or adjusted under 35 U.S.C. 154(b) by 303 days.

(21) Appl. No.: 14/239,846

(22) PCT Filed: Aug. 24, 2012

(86) PCT No.: PCT/US2012/052257
§ 371 (c)(1),
(2), (4) Date: Aug. 13, 2014

(87) PCT Pub. No.: WO2013/028970
PCT Pub. Date: Feb. 28, 2013

(65) Prior Publication Data
US 2014/0350147 A1    Nov. 27, 2014

Related U.S. Application Data

(60) Provisional application No. 61/526,858, filed on Aug. 24, 2011.

(51) Int. Cl.
| | | |
|---|---|---|
| *B22F 1/02* | (2006.01) |
| *C09D 7/12* | (2006.01) |
| *B22F 1/00* | (2006.01) |
| *B22F 9/04* | (2006.01) |
| *C23C 14/00* | (2006.01) |
| *C23C 14/14* | (2006.01) |
| *C01G 19/02* | (2006.01) |
| *C08K 3/08* | (2006.01) |
| *C08K 3/10* | (2006.01) |

(52) U.S. Cl.
CPC .......... *C09D 7/1291* (2013.01); *B22F 1/0055* (2013.01); *B22F 9/04* (2013.01); *C01G 19/02* (2013.01); *C23C 14/001* (2013.01); *C23C 14/0005* (2013.01); *C23C 14/14* (2013.01); *C08K 3/08* (2013.01); *C08K 3/10* (2013.01)

(58) Field of Classification Search
CPC ...... B22F 1/0055; B22F 9/04; C23C 14/0005; C23C 14/001; C23C 14/14; C09D 7/1291
USPC ......... 524/106, 127, 439, 440, 441; 523/200
See application file for complete search history.

(56) References Cited

U.S. PATENT DOCUMENTS

| | | |
|---|---|---|
| 2006/0235087 A1 | 10/2006 | Alexandridis et al. |
| 2008/0274354 A1 | 11/2008 | Rettker |
| 2012/0073978 A1 | 3/2012 | Malkowsky et al. |

FOREIGN PATENT DOCUMENTS

| | | |
|---|---|---|
| WO | 2009080522 A1 | 7/2009 |
| WO | 2010142567 A1 | 12/2010 |

*Primary Examiner* — Edward Cain
(74) *Attorney, Agent, or Firm* — The Webb Law Firm

(57) ABSTRACT

A method of producing metal flakes (72') is provided. The method includes: applying a layer of ionic liquid (70) to a substrate (24); forming a layer of metal (70) on the substrate (24) over the ionic liquid (70); and removing the layer of metal (70) from the substrate (24).

47 Claims, 3 Drawing Sheets

IONIC LIQUID RELEASE COAT FOR USE IN METAL FLAKE MANUFACTURE

CROSS-REFERENCE TO RELATED APPLICATIONS

This application is the United States national phase of International Application No. PCT/US2012/052257 filed Aug. 24, 2012, and claims priority to U.S. Provisional Application No. 61/526,858 filed Aug. 24, 2011, the disclosures of which are hereby incorporated in their entirety by reference.

BACKGROUND OF THE INVENTION

Field of the Invention

The present inventive subject matter relates generally to the art of functional and/or decorative flakes and/or the production thereof. Particular but not exclusive relevance is found in connection with high aspect ratio metal flakes for use in dispersions and/or suspensions, e.g., such as in inks, pigments, coatings and the like. It is to be appreciated however that aspects of the present inventive subject matter are also equally amenable to other like applications.

Description of Related Art

Conventionally, metal flakes have been formed by vapor depositing a thin layer of metal, e.g., aluminum (Al), on a polyethylene terephthalate (PET) carrier. Commonly, the carrier would first be provided with a release coating to facilitate subsequent removal of the metal from the carrier. Additionally, the release coating could also act as stabilizer, e.g., for the resulting Al flakes. In any event, this release coating is typically applied to the carrier as a solvent-based resin solution. After application, the solvent is evaporated or otherwise driven off, e.g., by heating in an oven, to form a polymer release coating on a surface of the carrier. The thin metal layer is then vapor deposited over the resulting release coating.

Commonly, to create the metal flakes, the thin metal layer is ultimately scraped and/or stripped from the carrier, e.g., with a doctor blade or another appropriate mechanical abrasion tool. To aid in separating the metal from the carrier during the stripping process, a solvent (e.g., such as acetone or the like) is again commonly used, this time to swell, soften and/or dissolve the release coating formed between the metal layer and the carrier. Typically, the metal film is broken into particles by the stripping process and the particles may be further sized and/or refined in later milling and/or other suitable processing steps. Metal flakes produced by this process have been used in printing applications, e.g., such as inks, and may often have a particle size from about 4 to about 12 microns and a thickness from about 150 to about 250 angstroms. The flakes can generally have a smooth mirror-like surface and a high aspect ratio, and coatings made from these flakes typically have a high specular reflectance and a low diffuse reflectance.

The aforementioned process, however, can have certain drawbacks and/or limitations. For example, after use, the carrier is generally undesirable waste material. Moreover, the use of solvents which may contain volatile organic compounds (VOCs) in the formation of the release coating and in the stripping process can be undesirable for environmental and/or other reasons.

Accordingly, a new and/or improved release coating and/or process for producing functional and/or decorative flakes is disclosed which addresses the above-referenced problem(s) and/or others.

SUMMARY OF THE INVENTION

This summary is provided to introduce concepts related to the present inventive subject matter. This summary is not intended to identify essential features of the claimed subject matter nor is it intended for use in determining or limiting the scope of the claimed subject matter.

In accordance with one embodiment, there is provided a method for producing metallic flakes using an ionic liquid as a release coating between a substrate and a thin metal film deposited thereover.

In some embodiments, there is provided a method of producing metal flakes, said method comprising: applying a layer of ionic liquid to a substrate; forming a layer of metal on the substrate over the ionic liquid; and removing the layer of metal from the substrate.

In some embodiments, there is provided a metal flake comprising a coating layer covering at least a part of a surface of the metal flake, the coating layer comprising an ionic liquid or fluid prepared from: (a) one or more cations selected from the group consisting of imidazolium; phosphonium; ammonium; pyrazolium; pyridinium; pyrrolidinium; sulfonium; and cationic polymers; wherein the cationic polymers, if present, are formed from one or more components selected from the group consisting of 4-chloromethylstyrene, 2-chloroethyl methacrylate, 2-chloroethyl acrylate, 4-chloro-1-butene, allyl chloride and allyl bromide reacted with butyl imidazole; and (b) one or more anions selected from the group consisting of bromide, nitrate, hexafluorophosphate, tetrafluoroborate, tosylate, brosylate, dialkyl phosphate, dialkyl phosphinate, bis(trifluoromethylsulfonyl)imide, triflate, and bisulfate.

In some embodiments, there is provided a dispersion comprising: (a) 2 to 20 weight percent of the above metal flake; (b) 0.1 to 5 weight percent of at least one ionic liquid; and (c) 75 to 97 weight percent of one or more solvents, on a basis of total weight of the dispersion.

Numerous advantages and benefits of the inventive subject matter disclosed herein will become apparent to those of ordinary skill in the art upon reading and understanding the present specification.

BRIEF DESCRIPTION OF THE DRAWINGS

The following detailed description makes reference to the figures in the accompanying drawings. However, the inventive subject matter disclosed herein may take form in various components and arrangements of components, and in various steps and arrangements of steps. The drawings are only for purposes of illustrating exemplary and/or preferred embodiments and are not to be construed as limiting. Further, it is to be appreciated that the drawings may not be to scale.

DETAILED DESCRIPTION

Figure 1:
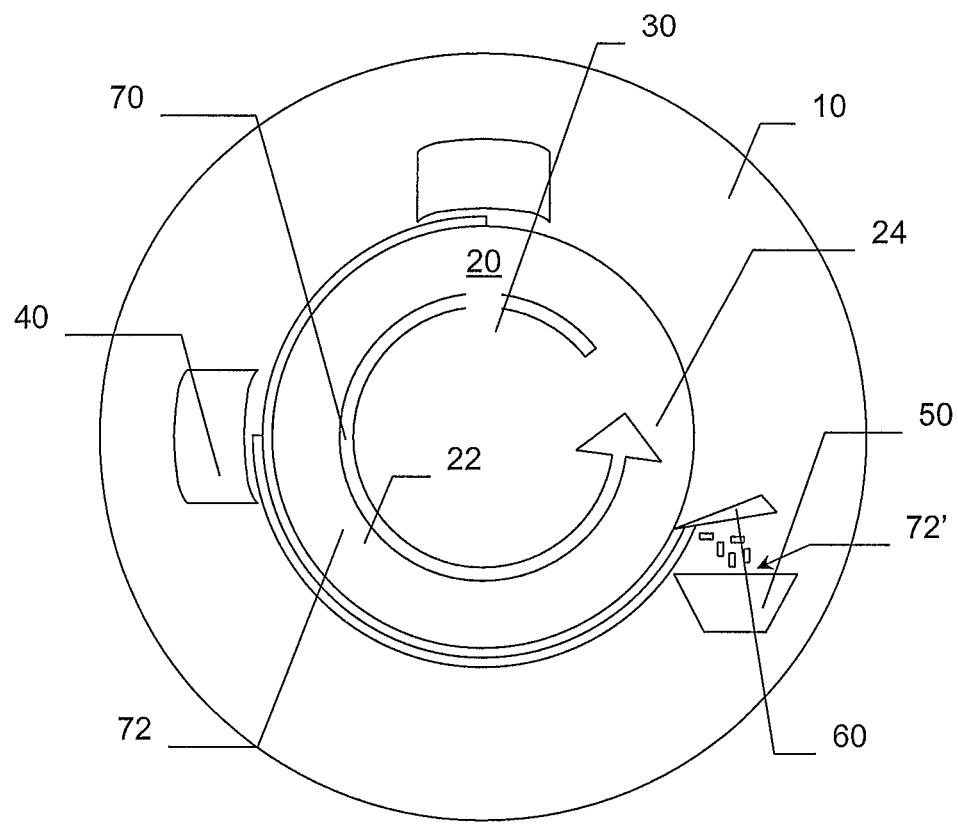
FIG. 1 is a diagrammatic illustration showing a vacuum chamber suitable for producing metallic flakes in accordance with aspects of the present inventive subject matter.

For clarity and simplicity, the present specification shall refer to structural and/or functional elements, relevant standards and/or protocols, and other components that are commonly known in the art without further detailed explanation as to their configuration or operation except to the extent they have been modified or altered in accordance with and/or to accommodate the preferred embodiment(s) presented herein.

In general, the present specification describes a flake manufacturing process employing one or more ionic liquids or fluids as a release coating. The ionic liquid (IL) release coat is essentially a salt in liquid state, which is largely made up of ion pairs, namely, cations (IF$^+$) and anions (X$^-$). Suitable ionic liquids may in general have: a freezing point below 100° C., for example; a high thermal stability (i.e., the IL will not decompose at high temperatures, e.g., in the range of approximately 250° C. to approximately 300° C. at normal atmospheric pressure and in the range of approximately 500° C. to approximately 600° C. at reduced pressure); and, a very low to negligible or no vapor pressure. For example, in accordance with particular embodiments, an IL (IF$^+$X$^-$) used for the release coat may comprise one or more cations (IF$^+$) selected from the following group:

Imidazolium, e.g., in the form

Phosphonium, e.g., in the form

⊕

P(R$_1$R$_2$R$_3$R$_4$);

Ammonium, e.g., in the form

Pyrazolium, e.g., in the form

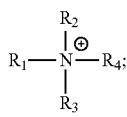

Pyridinium, e.g., in the form

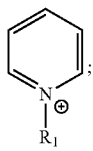

Pyrrolidinium, e.g., in the form

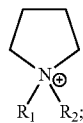

and

Sulfonium, e.g., in the form

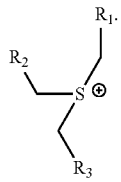

In addition to the molecular IL cations listed above, poly(ionic fluids) may also optionally be employed in and/or for the release coating. In this case, suitable starting components may include but are not restricted to 4-chloromethylstyrene, 2-chloroethyl methacrylate, 2-choroethyl acrylate, 4-chloro-1-butene and allyl chloride or bromide. For example, to make poly[1-(4-vinylbenzyl)-3-butylimidazolium]polymer, 4-chloromethylstyrene could be reacted with butylimidazole to form the 1-(4-vinylbenzyl)-3-butylimidazolium cation where the counterion could be any of those listed below. Then free radical polymerization may be used to make poly[1-(4-vinylbenzyl)-3-butylimidazolium], e.g., in the following form (where the counterion could be any of those listed below):

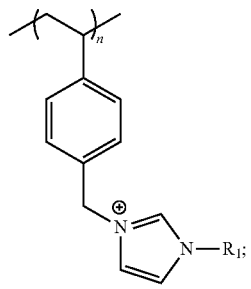

where R$_1$ is the butyl group specifically here, but could be any R$_1$ as described below. And (poly[2-(1-butylimidazolium-3-yl)ethylmethacrylate]), e.g., in the form

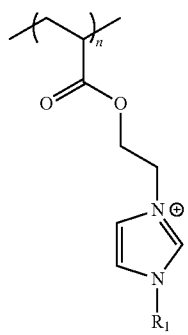

could be made from 2-chloroethyl methacrylate and butyl imidazole, where R1 is specifically the butyl group in this example but could be any R1 as described below in general. Moreover, by substituting selected IL cations above with a reaction of selected compounds listed above as reaction partners various suitable poly(ionic fluids) can be achieved and used for a release coating in accordance herewith.

Along with the forgoing, the IL (IF$^+$X$^-$) used for the release coat may comprise one or more anions (X$^-$) selected from the following group:
Bromide (Br$^\ominus$);
Nitrate (NO$_3^\ominus$);
Hexafluorophosphate (PF$_6^\ominus$);
Tetrafluoroborate (BF$_4^\ominus$);
Tosylate (i.e., toluene sulfonate or p-methylbenezenesulfonate)(OTs$^\ominus$);
Brosylate (i.e., 4-Bromobenzene sulfonate)(OBs$^\ominus$);
Dialkylphosphate, e.g., in the form

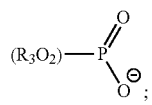

Dialkylphosphinate, e.g., in the form

Bis(trifluoromethylsulfonyl)imide, e.g., in the form

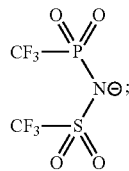

Triflate (CF$_3$SO$_3^\ominus$); and
Bisulfate (HSO$_4^\ominus$).

In the examples above, R$_1$, R$_2$, R$_3$ and R$_4$ refer to any hydrocarbon composed of 40 carbons or less with or without one or several heteroatoms of N, O, S and P and with or without one or several aromatic residue groups. R$_1$, R$_2$, R$_3$ and R$_4$ may be the same or dissimilar moieties.

More specifically, in suitable embodiments, the IL used for the release coating in selected applications may be:
triisobutylmethyltosylate, e.g., in the form

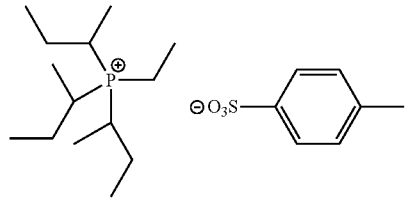

which is available under the trade designation Cyphos IL 106, from Cytec Industries, Inc., Five Garret Mountain Plaza, Woodland Park, N.J., 07424, USA;
tributylethylphosphoniumdiethylphosphate, e.g., in the form

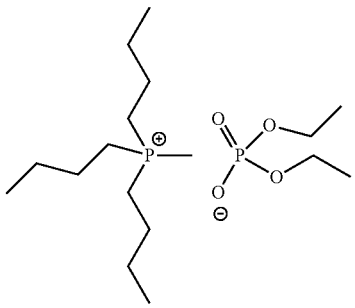

which is available under the trade designation Cyphos IL 169, from the aforementioned Cytec Industries, Inc.; or trihexyltetradecylphosponiumbis(2,4,4-trimethylpentyl) phosphinate, e.g., in the form

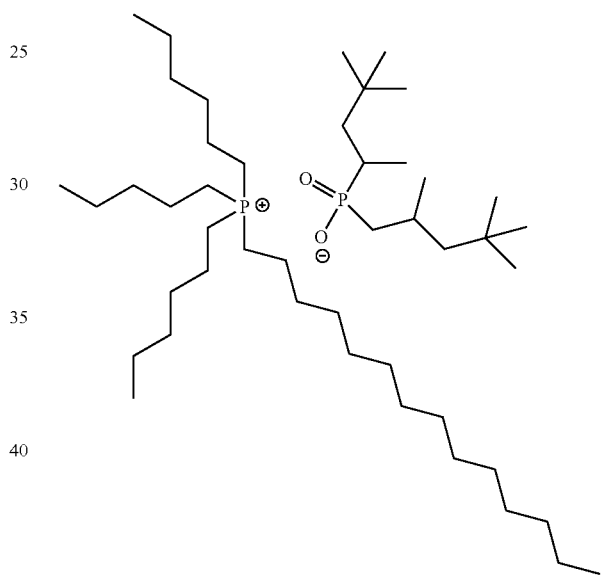

which is available under the trade designation Cyphos IL 104, from the aforementioned Cytec Industries, Inc.

Figure 3:
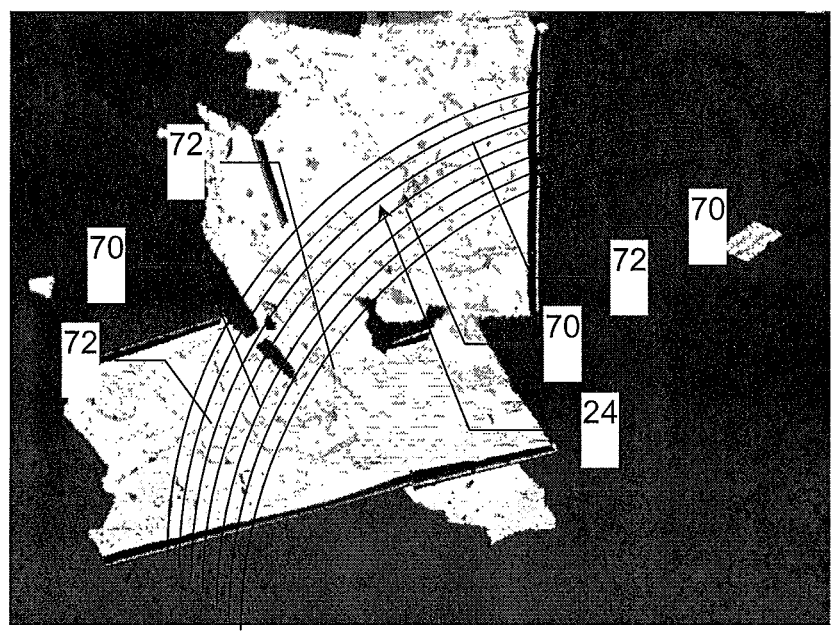
FIG. 3 is a micrograph showing exemplary Al flakes produced in accordance with aspects of the present inventive subject matter.

In one experiment, Cyphos IL 104 was applied as a release coat on a substrate at a coverage density of about 0.0017 grams meter$^{-2}$ and a thin Al layer was formed thereover. The substrate was a PET carrier film and Al flakes were produced after removal of the metal from the substrate by mere shaking of the same. Notably, the IL provided an excellent release coat and dispersive properties for the Al flakes. FIG. 3 shows a microscopic image the Al flake obtained in this case. The resulting flakes exhibit a planar and/or otherwise desirable morphology with excellent metallic optical properties, e.g., as compared using a conventional release coat under similar conditions.

While generally acceptable as release coatings, experimentation revealed that Cyphos IL 106 and 169 had less of an impact on the aforementioned phenomenon and that higher concentrations had to be used to stabilize the flake. This can be explained by examination of the structures of the three ionic liquids. In particular, the decreasing organic character in the series of ILs (i.e., Cyphos IL 104>106~169)

means there is less adsorption to the flakes, the magnitude of the adsorption being driven by the organic character of the IL, ion pair. Less adsorption of IL to the flake results in degrading the optical metallic properties.

Included below is a table of optical properties achieved in the same test vehicle of a control of flakes done with a conventional polymeric release coat and another with 0.0017 gram m$^{-2}$ coverage density of Cyphos IL 104 as the release coat on the substrate. Samples included were treated and processed identically after freeing them from the substrate.

| Sample | 60o gloss | Flop Index | L* |
|---|---|---|---|
| Control | 280 | 24.5 | 31.2 |
| 0.0017 g m$^{-2}$ Cyphos IL 104 on substrate | 270 | 24.9 | 30.7 |

All the values above are within experimental error of the measuring instrument.

In various applications, different ILs may have added benefits. For example, where copper is the metal being vapor deposited on a substrate over the IL release coat, it was found experimentally that the following IL, 1-methyl-3-hexadecylimidazolium tosylate, applied at about 0.1 to about 0.0034 grams m$^{-2}$ to the substrate, can provide adequate stabilization to prevent or retardoxidation of the resulting copper flake, e.g., as compared to 1-methyl-3-methylimidazolium and 1-methyl-3-ethylimidazolium which tend not to afford as much stabilization, and hence can permit oxidation of the copper flakes to occur.

In one embodiment, metal flakes are produced using the aforementioned IL release coating. Suitably, the metal is vapor deposited in a thin layer on a substrate coated with the IL release coating. For example, the substrate may provide a polished or otherwise smooth surface onto which a thin layer of the IL release coating and a thin layer of metal are stacked, deposited or otherwise applied in turn. In one exemplary embodiment, the substrate is an outer curved surface of a rotating metal drum or the like. In another exemplary embodiment, the substrate may be a flexible web or polymer carrier, e.g., such as PET or another polyester film or other similar carrier.

In practice, the substrate surface is first coated with a thin layer of the IL release coating. Any suitable coating technique may be used to apply the IL release coating to the surface of the substrate, e.g., such as gravure or flexographic coating, vapor deposition, reverse-roll coating, etc. After the IL release coating has been applied to the surface of the substrate, a thin layer of metal is formed over the IL release coating. In practice, the metal layer may be formed from aluminum, copper, silver, chromium, nichrome, tin, zinc, indium, indium tin oxide, zinc sulfide or suitable alloys of the foregoing. In one exemplary embodiment, the thin metal layer is formed by vapor deposition, e.g., in a vacuum chamber or other like low pressure environment. Due to the low vapor pressure of the IL, the IL release coat can be employed in and/or otherwise withstand exposure to a vacuum chamber or other like low pressure environment. That is to say, due to the low vapor pressure of the IL, the IL release coating will for the most part remain as a liquid on the surface of the substrate and will not evaporate therefrom, e.g., even under a deep vacuum in a vacuum chamber suitable for vapor deposition of the subsequently formed metal layer. In fact, in one optional embodiment, the IL release coating may be applied to the surface of the substrate within the same vacuum chamber used to vapor deposit the metal layer thereover.

After the thin metal layer has been formed over the IL release coating, it subsequently scraped, stripped and/or otherwise removed from the substrate. It is to be appreciated that the IL release coating facilitates this metal stripping and/or removal process by acting as a barrier between the metal layer and the underlying substrate, which barrier inhibits the metal layer from adhering or otherwise bonding directly to the surface of the substrate. In one suitable embodiment, a doctor blade or other suitable mechanical abrasion tool is used to scrape or otherwise strip the thin metal layer from the surface of the substrate. Alternately, other suitable stripping processes may be employed. For example, in one optional embodiment employing a flexible web or other suitable carrier as the substrate (e.g., a PET or other polymer film), the metal layer may be removed by simply shaking or vibrating the carrier or substrate so that the metal layer separates and/or is otherwise removed therefrom, e.g., without mechanical abrasion by a tool. In any event, however, the metal film is suitably broken into particles or flakes by the stripping and/or removal process and the particles or flakes may optionally be further sized and/or refined in later milling and/or other appropriate processing steps.

After stripping, the metal flakes are suitably collected in a storage bin or other appropriate container. Optionally, the storage bin or container may also hold a suitable amount of IL to cover and/or pacify the collected flakes, e.g., protecting the collected flakes from exposure to water and/or oxygen so as to guard against a potential reaction of the flakes therewith. Alternately, other non-volatile fluids may be employed for this purpose, e.g., oils, etc. Optionally, additional milling and/or other suitable processing may be applied to the collected flakes to size, separate and/or otherwise refine the flakes as desired for selected applications.

In some embodiments, there is provided a dispersion comprising: (a) 2 to 20 weight percent of the metal flakes described herein; (b) 0.1 to 5 weight percent of at least one ionic liquid; and (c) 75 to 97 weight percent of one or more solvents, on a basis of total weight of the dispersion. It should be understood that any numerical range recited herein is intended to include all sub-ranges subsumed therein. For example, a range of "2 to 20" is intended to include any and all sub-ranges between and including the recited minimum value of 2 and the recited maximum value of 20, that is, all sub-ranges beginning with a minimum value equal to or greater than 2 and ending with a maximum value equal to or less than 20, and all sub-ranges in between, e.g., 5 to 20, or 5.5 to 15, or 10 to 20.

In some preferred embodiments, a dispersion is provided comprising: (a) 3 to 18 weight percent of the metal flakes described herein; (b) 0.2 to 4 weight percent of at least one ionic liquid; and (c) 77 to 96 weight percent of one or more solvents, more preferred a dispersion comprising: (a) 4 to 15 weight percent of the metal flakes described herein; (b) 0.5 to 13 weight percent of at least one ionic liquid; and (c) 80 to 95 weight percent of one or more solvents, on a basis of total weight of the dispersion.

In some further preferred embodiments, the aforementioned amounts of components of the dispersion sum up to at least 90 weight percent, preferably at least 95 weight percent, more preferred to at least 98 weight percent, on the basis of the total weight of the dispersion. It is especially preferred that they sum up to at least 99.7 weight percent or even 100 weight percent.

In some embodiments, the amount of ionic liquids is preferably between 2 and 35 weight percent, more preferred between 3 and 22 weight percent, even more preferred between 4 and 15 weight percent, based on the weight of metal flakes.

With reference now to FIG. 1, there is illustrated a vacuum chamber 10 which contains a rotating drum 20 that selectively rotates in the direction shown by arrow 22. The vacuum chamber 10 is suitably subjected to a vacuum by a vacuum source (not shown) for evacuating the chamber 10. Optionally, an auxiliary turbo pump (not shown) may also be provided for holding the vacuum at a desired level within the chamber 10 without breaking the vacuum. In any event, as shown, a rotating outer surface 24 of the drum 20 acts as the above-mentioned substrate.

As illustrated, also contained in the vacuum chamber 10 is a coater 30 suitable for applying a thin layer of the IL release coating 70 to the surface 24 of the drum 20 as it travels past the coater 30. In practice, the coater 30 may comprise a reverse-roll coater, a gravure or flexographic coater, suitable vapor deposition equipment or other equipment adapted to apply the thin layer of the IL release coating 70 to the surface 24 of the drum 20 as it travels past the coater 30. In one suitable embodiment, the IL release coating 70 may be applied at a coverage density of about 0.0017 grams meter$^{-2}$.

Additionally, as shown, a metalizer 40 is contained in the vacuum chamber 10. The metalizer 40 applies a thin layer of metal 72 over the IL release coating 70 carried on the surface 24 of the drum 20 as it travel past the metalizer 40. In one exemplary embodiment, the metalizer 40 may comprise suitable vapor deposition equipment for depositing the thin layer of metal 72 on the IL release coating 70 carried on the surface 24 of the drum 20 as it travels past the metalizer 40.

As shown, a stripper 50 is further provided in the vacuum chamber 10. The stripper 50 scrapes and/or otherwise removes the metal layer 72 (and optionally the accompanying IL release coating layer 70) from the surface 24 of the drum 20 as it travels past the stripper 50. Optionally, the stripper 50 may comprise a doctor blade or other suitable abrasion tool adapted to remove the metal layer 72 from the surface 24 of the drum 20 as it travels past the stripper 50. Suitably, this stripping process breaks the metal layer 72 into flakes or particles 72' which are collected in a collection bin or container 60. Optionally, the collection bin or container 60 may also hold an additional amount of IL or other non-volatile fluid suitable to cover and/or pacify the collected flakes or particles 72'. Once collected, additional milling and/or other suitable processing may optionally be applied to the collected flakes 72' to size, separate and/or otherwise refine the flakes 72' as desired for selected applications.

Figure 2:
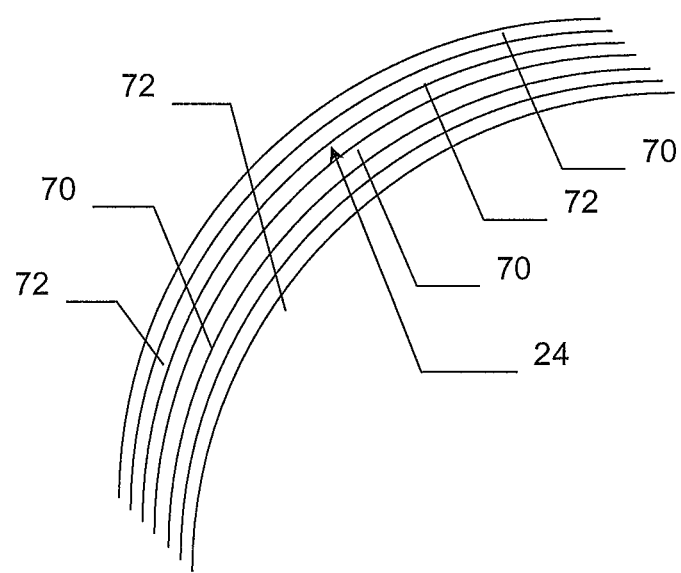
FIG. 2 is a diagrammatic illustration showing multiple alternating layers of an IL release coating and a thin metal film being built-up on a surface of a drum in accordance with aspects of the present inventive subject matter.

In the illustrated embodiment of FIG. 1, a single layer 70 of the IL release coating and a single layer 72 of the metal are applied in turn on the surface 24 of the drum 20 before the stripping process is carried out by the stripper 50. However, it is to be appreciated, that in practice, multiple alternating layers of the IL release coating 70 and the metal 72 (e.g., as shown in FIG. 2) may be built-up on the surface 24 of the drum 20 prior to the stripping process being executed by the stripper 50. In this way, additional flake production can be achieved with each revolution of the drum 20.

Additionally, while FIG. 1 illustrates the outer surface 24 of the drum 20 providing the substrate on which the layers 70 and 72 are applied in turn, in alternate embodiments, the substrate may take the form of a PET or other polyester film or some other suitable carrier web or film. Moreover, while certain processing stations (e.g., such as the coater 30, the stripper 50 and the collection bin 60) are illustrated in FIG. 1 as being contained in the vacuum chamber 10, optionally, one or more of these station may reside outside the vacuum chamber 10. Moreover, it is to be appreciated that additional processing stations may be included either inside or outside the vacuum chamber. For example, additional coaters or the like may be included to apply additional layers of material, such as protective coatings on either or both sides of the metal layer, or to create multilayer flakes, etc. In other suitable embodiments, additional processing stations may provide for embossing of the metal flake.

In any event, it is to be appreciated that in connection with the particular exemplary embodiment(s) presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

According to a 1$^{st}$ aspect, the invention relates to a method of producing metal flakes, said method comprising:
applying a layer of ionic liquid to a substrate;
forming a layer of metal on the substrate over the ionic liquid; and
removing the layer of metal from the substrate.

According to an 2$^{nd}$ aspect, the invention relates to the method of aspect 1, wherein said ionic liquid comprises at least one of triisobutylmethyl tosylate, tributylethylphosphonium diethylphosphate, trihexyltetradecylphosphonium bis(2,4,4-trimethylpentyl)phosphinate, and 1-methyl-3-hexadecylimidazolium tosylate.

According to a 3$^{rd}$ aspect the invention relates to any of the methods of aspect 1 or 2, wherein forming the layer of metal includes vapor depositing the layer of metal on the substrate over the ionic liquid in a vacuum chamber.

According to a 4$^{th}$ aspect, the invention relates to the method of aspect 3, wherein the layer of ionic liquid is applied to the substrate in the vacuum chamber.

According to a 5$^{th}$ aspect, the invention relates to the method of aspect 3, wherein the layer of ionic liquid is applied to the substrate outside of the vacuum chamber.

According to a 6$^{th}$ aspect, the invention relates to any of the methods of aspects 1 to 5, wherein the layer of ionic liquid is applied by one of reverse-roll coating, gravure coating, flexographic coating and vapor deposition, preferably by one of reverse-roll coating, gravure coating and flexographic coating.

According to a 7th aspect, the invention relates to any of the methods of aspects 1 to 6, wherein the substrate comprises an outer rotating surface of a drum.

According to an 8th aspect, the invention relates to any of the methods of aspects 1 to 7, wherein the substrate comprises a flexible polymer carrier.

According to a 9th aspect, the invention relates to the method of aspect 8, wherein removing the layer of metal from the substrate comprises at least one of shaking or vibrating the carrier.

According to a 10th aspect, the invention relates to any of the methods of aspects 1 to 9, wherein the layer of metal is removed from the substrate by mechanical abrasion with a tool.

According to a 11th aspect, the invention relates to any of the methods of aspects 1 to 10, wherein removing the layer of metal from the substrate at least partially breaks the layer of metal into flakes.

According to a 12th aspect, the invention relates to any of the methods of aspects 1 to 11, further comprising: collecting the flakes in a container, said container further holding an amount of non-volatile fluid sufficient to pacify the collected flakes.

According to a 13th aspect, the invention relates to any of the methods of aspects 1 to 12, wherein the non-volatile fluid includes at least one of ionic liquid and oil.

According to a 14th aspect the invention relates to any of the methods of aspects 1 to 13, wherein said metal comprises: at least one of aluminum, copper, silver, gold and indium tin oxide.

According to a 15th aspect, the invention relates to any of the methods of aspects 1 to 14, wherein said ionic liquid comprises trihexyltetradecylphosphonium bis(2,4,4-trimethylpentyl)phosphinate, and the metal layer comprises aluminum.

According to a 16th aspect, the invention relates to any of the methods of aspects 1 to 15, wherein said ionic liquid comprises 1-methyl-3-hexadecylimidazolium tosylate, and the metal layer comprises copper.

According to a 17th aspect, the invention relates to a metal flake made by a method according to any of the aspects 1 to 16.

According to a 18th aspect, the invention relates to a dispersion, suspension, pigment, ink or coating comprising a metal flake made by the method according to any of aspects 1 to 16.

According to a 19th aspect, the invention relates to a metal flake comprising a coating layer covering at least a part of the surface comprising an ionic liquid or fluid prepared from:
(a) one or more cations selected from the group consisting of imidazolium; phosphonium; ammonium; pyrazolium; pyridinium; pyrrolidinium; sulfonium; and cationic polymers;
wherein the cationic polymers, if present, are formed from one or more components selected from the group consisting of 4-chloromethylstyrene, 2-chloroethyl methacrylate, 2-chloroethyl acrylate, 4-chloro-1-butene, allyl chloride and allyl bromide reacted with butyl imidazole; and
(b) one or more anions selected from the group consisting of bromide, nitrate, hexafluorophosphate, tetrafluoroborate, tosylate, brosylate, dialkyl phosphate, dialkyl phosphinate, bis(trifluoromethylsulfonyl)imide, triflate, and bisulfate. Preferably the metal flake is prepared according to any of the aspects 1 to 16.

The coating layer can be partly or even completely removed from the surface of the metal flakes, for example in which the metal flake is dispersed into a solvent. However, based on the corresponding ionic liquid one or more components of the ionic liquid can stronger adhere to the surface and, thus, results in a surface in dispersion enriched by one or more of the components. In this context, one component might even be the sole component adhering to the surface of the metal flake. In some embodiments, the metal flakes formed according to the present invention can have a residue of the ionic liquid or fluid thereon. In some embodiments, the metal flakes formed according to the present invention can be present in the ionic liquid or fluid, for example to cover and/or pacify the flakes.

With respect to the 19th aspect, in some embodiments, the metal flakes can be formed by any of the methods of aspects 1 to 16. In other embodiments, the metal flakes can be any formed by any method other than those of aspects 1 to 16. Such other metal flakes can have essentially no coating thereon, or could be at least partially or fully coated with a suitable coating well known to those skilled in the art, prior to at least partial full coating with a layer of ionic liquid or fluid as disclosed above. Non-limiting examples of such other metal flakes include metal flakes that are commercially available from Eckart America Corporation of Painesville, Ohio. The ionic liquid or fluid can be applied at about 0.1 to about 0.0034 grams m$^{-2}$ to such other metal flakes, by any application method such as is disclosed above, for example one of reverse-roll coating, gravure coating, flexographic coating and vapor deposition.

According to a 20th aspect, the invention relates to a metal flake according to aspect 19, wherein the coating layer covers at least one side, preferably the lower side, of the metal flake. As used herein, the term "lower side" of the metal flake refers to the side of the flake originally oriented towards the substrate.

According to a 21st aspect, the invention relates to a metal flake according to aspect 19, wherein the coating layer covers the lower and upper side of the metal flake. It is especially preferred according to a specific embodiment of this aspect that the sides of the flake are covered by a minor amount of said coating or are even essentially free of said coating layer.

According to a 22nd aspect, the invention relates to the metal flake of any of aspects 19 to 21, wherein the imidazolium cation is

wherein $R_1$ and $R_2$ are each independently selected from hydrocarbons composed of 40 carbons or less with or without one or several heteroatoms of N, O, S and P and with or without one or several aromatic residue groups.

According to a 23rd aspect, the invention relates to the metal flake of any of aspects 19 to 21, wherein the phosphonium cation is $^{\oplus}P(R_1R_2R_3R_4)$, wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

According to a 24th aspect, the invention relates to the metal flake of any of aspects 19 to 21, wherein the ammonium cation is

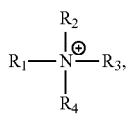

wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

According to a 25$^{th}$ aspect, the invention relates to the metal flake of any of aspects 19 to 21, wherein the pyrazolium cation is

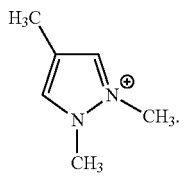

According to a 26$^{th}$ aspect, the invention relates to the metal flake of any of aspects 19 to 21, wherein the pyridinium cation is

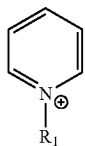

wherein $R_1$ is selected from hydrocarbons composed of 40 carbons or less with or without one or several heteroatoms of N, O, S and P and with or without one or several aromatic residue groups.

According to a 27$^{th}$ aspect, the invention relates to the metal flake of any of aspects 19 to 21, wherein the pyrrolidinium cation is

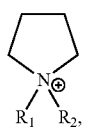

wherein $R_1$ and $R_2$ are each independently selected from hydrocarbons composed of 40 carbons or less with or without one or several heteroatoms of N, O, S and P and with or without one or several aromatic residue groups.

According to a 28$^{th}$ aspect, the invention relates to the metal flake of any of aspects 19 to 21, wherein the sulfonium cation is

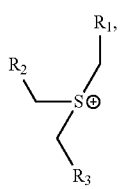

wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

According to a 29$^{th}$ aspect, the invention relates to the metal flake of any of aspects 19 to 21, wherein the cationic polymer comprises poly[1-(4-vinylbenzyl)-3-butylimidazolium].

According to a 30$^{th}$ aspect, the invention relates to the metal flake of any of aspects 19 to 21, wherein the cationic polymer comprises:

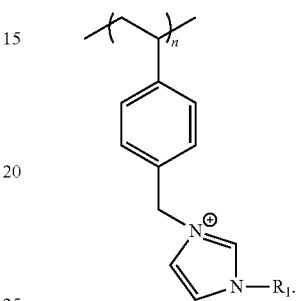

According to a 31$^{st}$ aspect, the invention relates to the metal flake of any of aspects 19 to 21, wherein the cationic polymer comprises poly[2-(1-butylimidazolium-3-yl)ethylmethacrylate].

According to a 32$^{nd}$ aspect, the invention relates to the metal flake of any of aspects 19 to 21, wherein the cationic polymer comprises:

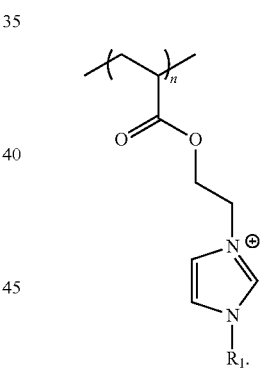

According to a 33$^{rd}$ aspect, the invention relates to the metal flake of any of aspects 19 to 21, wherein the dialkyl phosphate anion is

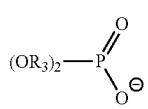

wherein $R_3$ is selected from hydrocarbons composed of 40 carbons or less with or without one or several heteroatoms of N, O, S and P and with or without one or several aromatic residue groups.

According to a 34$^{th}$ aspect, the invention relates to the metal flake of any of aspects 19 to 21, wherein the dialkyl phosphinate anion is

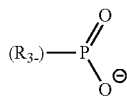

wherein R$_3$ is selected from hydrocarbons composed of 40 carbons or less with or without one or several heteroatoms of N, O, S and P and with or without one or several aromatic residue groups.

According to a 35$^{th}$ aspect, the invention relates to the metal flake of any of aspects 19 to 21, wherein the ionic liquid or fluid comprises: at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

According to a 36$^{th}$ aspect, the invention relates to the metal flake of any of aspects 19 to 21, wherein the ionic liquid comprises trihexyltetradecylphosphonium bis(2,4,4-trimethylpentyl)phosphinate, and the metal layer comprises aluminum.

According to a 37$^{th}$ aspect, the invention relates to the metal flake of any of aspects 19 to 21, wherein the ionic liquid comprises 1-methyl-3-hexadecylimidazolium tosylate, and the metal layer comprises copper.

According to a 38$^{th}$ aspect, the invention relates to the metal flake of any of aspects 19 to 37, wherein the coverage density of the coating layer is about 0.1 to about 0.0034 grams m$^{-2}$.

According to a 39$^{th}$ aspect, the invention relates to the metal flake of any of aspects 19 to 38, wherein the metal flake comprises aluminum, copper, silver, chromium, nichrome, tin, zinc, indium, indium tin oxide, zinc sulfide, or alloys thereof.

According to a 40$^{th}$ aspect, the invention relates to the metal flake of any of aspects 19 to 39, wherein the flake has a particle size from about 4 to about 12 microns.

According to a 41$^{st}$ aspect, the invention relates to the metal flake of any of aspects 19 to 40, wherein the flake has a thickness of about 150 to about 250 angstroms.

According to a 42$^{nd}$ aspect, the invention relates to the metal flake of any of aspects 19 to 41, wherein the metal flake comprises alternating layers of coating and metal film.

According to a 43$^{rd}$ aspect, the invention relates to a dispersion, suspension, pigment, ink or coating comprising the metal flake according to any of aspects 19 to 42.

According to a 44$^{th}$ aspect, the invention relates to a dispersion comprising the metal flake according to any of aspects 19 to 42.

According to a 45$^{th}$ aspect, the invention relates to a dispersion comprising
(a) 2 to 20 weight percent of any of the metal flake prepared by any of the methods of aspects 1 to 16 or any of the metal flake of aspects 17 and 19 to 42;
(b) 0.1 to 5 weight percent of at least one ionic liquid;
(c) 75 to 97 weight percent of one or more solvents, on a basis of total weight of the dispersion.

According to a 46$^{th}$ aspect, the invention relates to the dispersion according to aspect 45, wherein said metal comprises at least one of aluminum, copper, silver, gold and indium tin oxide.

According to a 47$^{th}$ aspect, the invention relates to a dispersion according to any of aspects 45 to 46, wherein the amount of ionic liquids is between 2 and 35 weight percent, based on the weight of the metal flakes.

According to a 48$^{th}$ aspect, the invention relates to a dispersion according to any of aspects 45 to 47, wherein the ionic liquid comprises at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

According to a 49$^{th}$ aspect, the invention relates to a dispersion according to any of aspects 45 to 47, wherein said ionic liquid comprises trihexyltetradecylphosphonium bis(2,4,4-trimethylpentyl)phosphinate, and the metal layer comprises aluminum.

According to a 50$^{th}$ aspect, the invention relates to a dispersion according to any of aspects 45 to 47, wherein said ionic liquid comprises 1-methyl-3-hexadecylimidazolium tosylate, and the metal layer comprises copper.

According to a 51$^{th}$ aspect the invention relates to a dispersion according to any of aspects 45 to 50 wherein the dispersion further comprises another non-volatile fluid.

According to a 52$^{st}$ aspect, the invention relates to a dispersion according to aspect 51, wherein the non-volatile fluid comprises oil.

According to a 53$^{nd}$ aspect, the invention relates to a dispersion according to any of aspects 45 to 52.

The present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof.

What is claimed is:

1. A method of producing metal flakes, said method comprising:
    applying a layer of ionic liquid to a substrate;
    forming a layer of metal on the substrate over the ionic liquid; and
    removing the layer of metal from the substrate.

2. The method of claim 1, wherein said ionic liquid comprises:
    at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

3. The method of claim 1, wherein forming the layer of metal includes:
    vapor depositing the layer of metal on the substrate over the ionic liquid in a vacuum chamber.

4. The method of claim 3, wherein the layer of ionic liquid is applied to the substrate in the vacuum chamber.

5. The method of claim 3, wherein the layer of ionic liquid is applied to the substrate outside the vacuum chamber.

6. The method of claim 1, wherein the layer of ionic liquid is applied by one of reverse-roll coating, gravure coating, flexographic coating and vapor deposition.

7. The method of claim 1, wherein the substrate comprises an outer rotating surface of a drum.

8. The method of claim 1, wherein the substrate comprises a flexible polymer carrier.

9. The method of claim 8, wherein removing the layer of metal from the substrate comprises at least one of shaking or vibrating the carrier.

10. The method of claim 1, wherein the layer of metal is removed from the substrate by mechanical abrasion with a tool.

11. The method of claim 1, wherein removing the layer of metal from the substrate at least partially breaks the layer of metal into flakes.

12. The method of claim 1, further comprising:
collecting the flakes in a container, said container further holding an amount of non-volatile fluid sufficient to pacify the collected flakes.

13. The method of claim 12, wherein the non-volatile fluid includes at least one of ionic liquid and oil.

14. The method of claim 1, wherein said metal comprises:
at least one of aluminum, copper, silver, gold and indium tin oxide.

15. The method of claim 1, wherein said ionic liquid comprises trihexyltetradecylphosphonium bis(2,4,4-trimethylpentyl)phosphinate, and the metal layer comprises aluminum.

16. The method of claim 1, wherein said ionic liquid comprises 1-methyl-3-hexadecylimidazolium tosylate, and the metal layer comprises copper.

17. A metal flake made by a method comprising:
applying a layer of ionic liquid to a substrate;
forming a layer of metal on the substrate over the ionic liquid; and
removing the layer of metal from the substrate,
wherein the metal flake comprises a coating layer covering at last a part of a surface of the metal flake, the coating layer comprising an ionic liquid or fluid prepared from,
(a) one or more cations selected from the group consisting of imidazolium; phosphonium; ammonium; pyrazolium; pyridinium; pyrrolidinium; sulfonium; and cationic polymers;
wherein the cationic polymers, if present, are formed from one or more components selected from the group consisting of 4-chloromethylstyrene, 2-chloroethyl methacrylate, 2-chloroethyl acrylate, 4-chloro-1-butene, allyl chloride and allyl bromide reacted with butyl imidazole; and
(b) one or more anions selected from the group consisting of bromide, nitrate, hexafluorophosphate, tetrafluoroborate, tosylate, brosylate, dialkyl phosphate, dialkyl phosphinate, bis(trifluoromethylsulfonyl)imide, triflate, and bisulfate,
wherein the flake has a particle size from about 4 to about 12 microns.

18. A dispersion comprising a metal flake prepared by a method comprising:
applying a layer of ionic liquid to a substrate;
forming a layer of metal on the substrate over the ionic liquid; and
removing the layer of metal from the substrate,
wherein the dispersion comprises,
(a) 2 to 20 weight percent of the metal flake, on a basis of total weight of
the dispersion;
(b) 0.1 to 5 weight percent of at least one ionic liquid, on a basis of total weight of the dispersion; and
(c) 75 to 97 weight percent of one or more solvents,
on a basis of total weight of the dispersion.

19. The metal flake of claim 17, wherein the imidazolium cation is

wherein $R_1$ and $R_2$ are each independently selected from hydrocarbons composed of 40 carbons or less with or without one or several heteroatoms of N, O, S and P and with or without one or several aromatic residue groups.

20. The metal flake of claim 17, wherein the phosphonium cation is $^\oplus P(R_1R_2R_3R_4)$, wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

21. The metal flake of claim 17, wherein the ammonium cation is

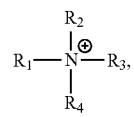

wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

22. The metal flake of claim 17, wherein the pyrazolium cation is

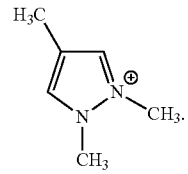

23. The metal flake of claim 17, wherein the pyridinium cation is

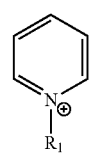

wherein $R_1$ is selected from hydrocarbons composed of 40 carbons or less with or without one or several heteroatoms of N, O, S and P and with or without one or several aromatic residue groups.

24. The metal flake of claim 17, wherein the pyrrolidinium cation is

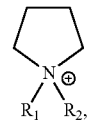

wherein $R_1$ and $R_2$ are each independently selected from hydrocarbons composed of 40 carbons or less with or without one or several heteroatoms of N, O, S and P and with or without one or several aromatic residue groups.

25. The metal flake of claim 17, wherein the sulfonium cation is

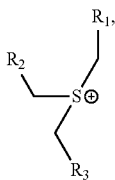

wherein $R_1$, $R_2$, $R_3$ and $R_4$ are each independently selected from hydrocarbons composed of 40 carbons or less with or without one or several heteroatoms of N, O, S and P and with or without one or several aromatic residue groups.

26. The metal flake of claim 17, wherein the cationic polymer comprises poly [1-(4-vinylbenzyl)-3-butylimidazolium].

27. The metal flake of claim 17, wherein the cationic polymer comprises:

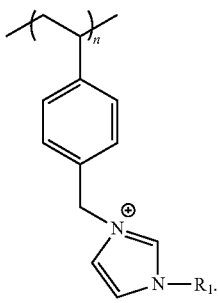

28. The metal flake of claim 17, wherein the cationic polymer comprises poly [2-(1-butylimidazolium-3-yl)ethylmethacrylate].

29. The metal flake of claim 17, wherein the cationic polymer comprises:

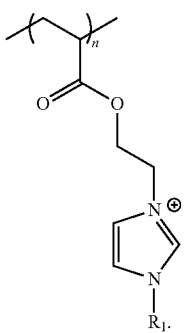

30. The metal flake of claim 17, wherein the dialkyl phosphate anion is

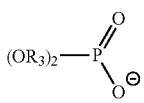

wherein $R_3$ is selected from hydrocarbons composed of 40 carbons or less with or without one or several heteroatoms of N, O, S and P and with or without one or several aromatic residue groups.

31. The metal flake of claim 17, wherein the dialkyl phosphinate anion is

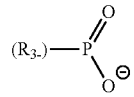

wherein $R_3$ is selected from hydrocarbons composed of 40 carbons or less with or without one or several heteroatoms of N, O, S and P and with or without one or several aromatic residue groups.

32. The metal flake of claim 17, wherein the ionic liquid or fluid comprises:
at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

33. The metal flake of claim 17, wherein the ionic liquid comprises trihexyltetradecylphosphonium bis(2,4,4-trimethylpentyl)phosphinate, and the metal layer comprises aluminum.

34. The metal flake of claim 17, wherein the ionic liquid comprises 1-methyl-3-hexadecylimidazolium tosylate, and the metal layer comprises copper.

35. The metal flake of claim 17, wherein the coverage density of the coating layer is about 0.1 to about 0.0034 grams m$^{-2}$.

36. The metal flake of claim 17, wherein the metal flake comprises aluminum, copper, silver, chromium, nichrome, tin, zinc, indium, indium tin oxide, zinc sulfide, or alloys thereof.

37. The metal, flake of claim 17, wherein the flake has a thickness of about 150 to about 250 angstroms.

38. The metal flake of claim 17, wherein the metal flake comprises alternating layers of coating and metal film.

39. The dispersion of claim 18, wherein said metal comprises:
at least one of aluminum, copper, silver, gold and indium tin oxide.

40. The dispersion of claim 18, wherein the amount of ionic liquids is between 2 and 35 weight percent, based on the weight of the metal flakes.

41. The dispersion of claim 18, wherein the ionic liquid comprises:
at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

42. The dispersion of claim 18, wherein said ionic liquid comprises trihexyltetradecylphosphonium bis(2,4,4-trimethylpentyl)phosphinate, and the metal layer comprises aluminum.

43. The dispersion of claim 18, wherein said ionic liquid comprises 1-methyl-3-hexadecylimidazolium tosylate, and the metal layer comprises copper.

44. The dispersion according to claim 18, wherein the dispersion further comprises another non-volatile fluid.

45. The dispersion according to claim 44, wherein the non-volatile fluid comprises oil.

46. A metal flake made by a method comprising:
applying a layer of ionic liquid to a substrate;
forming a layer of metal on the substrate over the ionic liquid; and
removing the layer of metal from the substrate, wherein the metal flake a coating layer covering at last a part of a surface of the metal flake, the coating layer comprising an ionic liquid or fluid prepared from, (a) one or more cations selected from the group consisting of imidazolium; phosphonium; ammonium; pyrazolium; pyridinium; pyrrolidinium; sulfonium; and cationic polymers;

wherein the cationic polymers, if present, are formed from one or more components selected from the group consisting of 4-chloromethylstyrene, 2-chloroethyl methacrylate, 2-chloroethyl acrylate, 4-chloro-1-butene, allyl chloride and allyl bromide reacted with butyl imidazole; and (b) one or more anions selected from the group consisting of bromide, nitrate, hexafluorophosphate, tetrafluoroborate, tosylate, brosylate, dialkyl phosphate, dialkyl phosphinate, bis(trifluoromethylsulfonyl)imide, triflate, and bisulfate, wherein the ionic liquid or fluid comprises at least one of triisobutylmethyl tosylate, tributylethylphosphonium diethylphosphate, trihexyltetradecylphosphonium bis(2,4,4-trimethylpentyl) phosphinate, and 1-methyl-3-hexadecylimidazolium tosylate.

47. A metal flake made by a method comprising:

applying a layer of ionic liquid to a substrate;

forming a layer of metal on the substrate over the ionic liquid; and removing the layer of metal from the substrate, wherein forming the layer of metal includes vapor depositing the layer of metal on the substrate over the ionic liquid in a vacuum chamber.

\* \* \* \* \*

UNITED STATES PATENT AND TRADEMARK OFFICE
CERTIFICATE OF CORRECTION

PATENT NO. : 9,631,101 B2  
APPLICATION NO. : 14/239846  
DATED : April 25, 2017  
INVENTOR(S) : John R. Moffatt Page 1 of 1

It is certified that error appears in the above-identified patent and that said Letters Patent is hereby corrected as shown below:

In the Claims

Column 20, Line 35, Claim 37, delete "metal," and insert -- metal --

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*